United States Patent
Menon et al.

(10) Patent No.: US 6,867,593 B2
(45) Date of Patent: Mar. 15, 2005

(54) MODULAR LOCAL COIL SET FOR MAGNETIC RESONANCE IMAGING

(75) Inventors: Ashok Menon, Milwaukee, WI (US); Derek Seeber, Wauwatosa, WI (US); Jovan Jevtic, West Allis, WI (US)

(73) Assignee: IGC-Medical Advances, Inc., Milwaukee, WI (US)

( * ) Notice: Subject to any disclaimer, the term of this patent is extended or adjusted under 35 U.S.C. 154(b) by 0 days.

(21) Appl. No.: 10/722,010

(22) Filed: Nov. 25, 2003

(65) Prior Publication Data

US 2004/0106336 A1 Jun. 3, 2004

Related U.S. Application Data

(63) Continuation-in-part of application No. 10/303,582, filed on Nov. 22, 2002, now Pat. No. 6,762,606.
(60) Provisional application No. 60/429,878, filed on Nov. 27, 2002.

(51) Int. Cl.$^7$ .................................................. G01V 3/00
(52) U.S. Cl. ...................................... 324/318; 600/422
(58) Field of Search ........................ 600/410, 421–423; 324/318–320

(56) References Cited

U.S. PATENT DOCUMENTS

| | | | | |
|---|---|---|---|---|
| 4,825,162 A | * | 4/1989 | Roemer et al. | 324/318 |
| 5,666,055 A | * | 9/1997 | Jones et al. | 324/318 |
| 5,905,378 A | * | 5/1999 | Giaquinto et al. | 324/318 |
| 6,498,489 B1 | * | 12/2002 | Vij | 324/322 |

* cited by examiner

*Primary Examiner*—Ramon M Barrera
(74) *Attorney, Agent, or Firm*—Quarles & Brady LLP

(57) ABSTRACT

A modular lower coil provides for a head, a vascular and, a thoracic/lumbar element that may interfit or be separated to provide individual imaging of these areas or a combined imaging region stretching from the head to the lower spine. A switch box allows individual ones of these elements to be connected to the MRI machine if necessary because of a limitation of inputs to the machine and provides for decoupling currents to minimize interference between the coil elements when one element is being used.

22 Claims, 2 Drawing Sheets

MODULAR LOCAL COIL SET FOR MAGNETIC RESONANCE IMAGING

CROSS-REFERENCE TO RELATED APPLICATIONS

This application is based on U.S. Provisional application No. 60/429,878 filed Nov. 27, 2002 and hereby claims the benefit of the application. This application is also a continuation in part of U.S. application Ser. No. 10/303,582 filed Nov. 22, 2002 now U.S. Pat. No. 6,762,606, and hereby incorporated by reference.

STATEMENT REGARDING FEDERALLY SPONSORED RESEARCH OR DEVELOPMENT

BACKGROUND OF THE INVENTION

The present invention relates to magnetic resonance imaging and, in particular, to local coils for use in magnetic resonance imaging.

Magnetic resonance imaging (MRI) detects the faint nuclear magnetic resonance (NMR) signals given off by protons in the presence of a strong magnetic field after excitation of the protons with a radio frequency signal. The NMR signals are detected using loop antennas termed "coils".

NMR signals are extremely faint and therefore "local coil" or "surface coils" may be designed such as can be placed in close proximity to the region of interest of the imaged object. The size of the local coils is kept small to allow them to be easily fit to the patient on the MRI patient table. Importantly, the small area of loops of the local coil provides improved signal strength relative to received noise. The local coils are in contrast to the whole body coil typically present in an MRI machine and useful for obtaining broad "survey" scans of the patient.

The small size of a local coil generally limits the volume over which the coil is sensitive. For imaging large areas of the body, for example, neurovascular imaging of the head, neck, and lower spine, the whole body coil with its lower signal to noise ratio must be used. Alternatively, coverage of this region can be obtained by using several local coils and taking multiple images of the patient and changing or repositioning the local coil in between images. This latter approach is time consuming and impractical in many situations.

BRIEF SUMMARY OF THE INVENTION

The present invention provides a modular local coil whose elements may be assembled together on the patient table to provide large area coverage or may be used individually for small area coverage. Because the coil elements are designed to be modular when they are assembled, the elements provide a continuous volume of sensitivity and adverse interference or coupling between the elements can be avoided. A switchbox allows each coil element to employ up to the maximum number of loops that can be accommodated by the MRI machine allowing the individual coil elements to provide comparable performance to other non-modular local coils.

Specifically, the present invention provides a modular local coil system for magnetic resonance imaging having at least three electrically independent multiple loop coil elements sized to assemble along an axis so as to provide a substantially continuous field coverage of a patient along that axis. Each of the coil elements has a cable and electrical connector providing communications with the multiple loops of the coil element, where the connectors are receivable by a connector receptacle on an MRI machine. A switch box provides coil-side connector receptacles receiving the connectors and an MRI machine-side cable and electrical connector receivable by the connector receptacle of the MRI machine selectively connecting coil elements to the MRI machine.

Thus, it is one object of the invention to provide a modular coil system where the coil elements may be used alone or in combination for different imaging requirements and for ease of positioning and assembly.

It is another object of the invention to provide a set of individually usable coils that are designed to work together to provide a field pattern when assembled.

It is another object of the invention to provide a modular coil system that provides coverage of a large region but wherein the individual elements employ many loops to provide signal-to-noise ratios comparable to other local coils.

The switch box may include circuit paths connecting disabling signals to the coil elements that are not selectively connected to the MRI machine.

Thus, it is another object of the invention to provide a set of coils that may be used individually or together without interference. The disabling of the coilsdetunes the unused coils so that they do not couple with the active coil.

The coil elements may include bases fitting against the upper surface of a patient table and abutting to align and space the coil elements from each other when assembled along the axis.

Thus, it is another object of the invention to provide a simple and intuitive method of assembling and holding the coil sections together.

At least two of the coil elements, when assembled together, may include antenna structure from one coil fitting within a volume defined by antenna structure of a second coil.

Thus, it is another object of the invention to provide a mechanism for providing substantially continuous field coverage between coil elements.

At least one coil element may be a head coil providing a volume for receiving a patient's head; one coil element may be a planar anterior coil fitting beneath the patient against a patient table; and at least one coil element may be a pair of opposed anterior and posterior coil fitting about the patient's upper torso.

Thus, it is one object of the invention to provide a modular coil having a range of flexible coil types that may be used individually.

These particular objects and advantages may apply to only some embodiments falling within the claims and thus do not define the scope of the invention.

DETAILED DESCRIPTION OF THE PREFERRED EMBODIMENT

Figure 1:
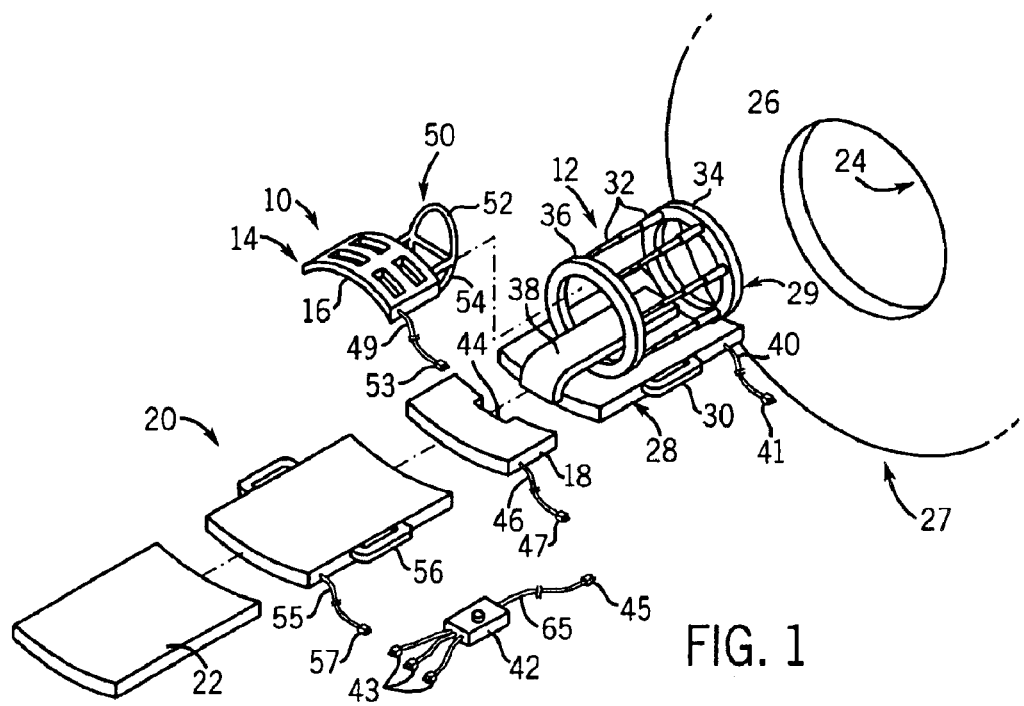
FIG. 1 is an exploded perspective view of the components of the modular coil of the present invention showing the head imaging element, anterior and posterior portions of the vascular imaging element, and the thoracic/lumbar imaging element above a portion of a patient table on which they normally rest.
Figure 2:
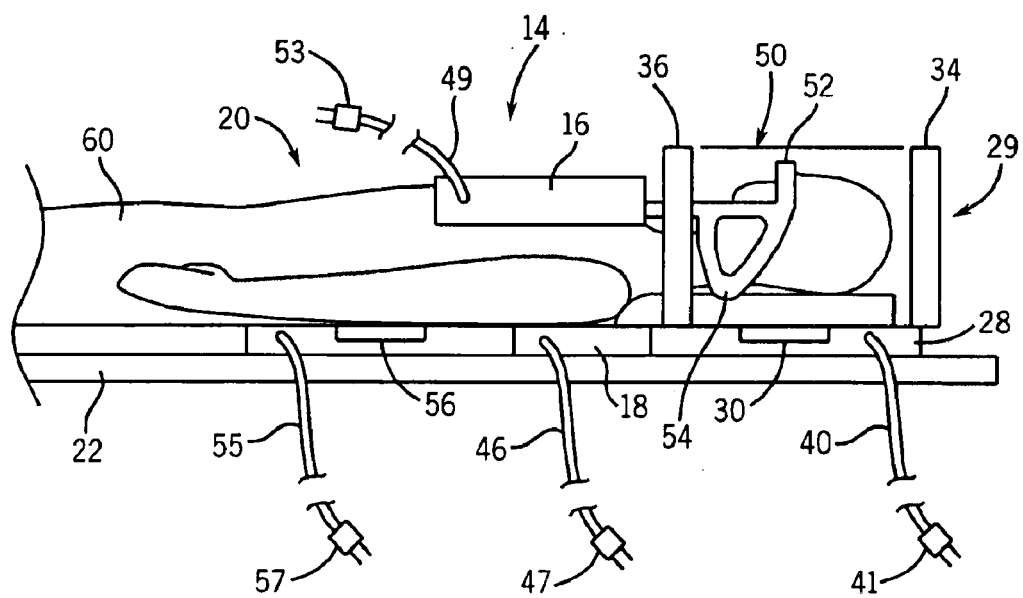
FIG. 2 is a side elevational view of the coil elements interconnected and positioned about a patient to provide imaging from the patient's head to the patient's lower spine.

Referring now to FIGS. 1 and 2, a modular coil 10 of the present invention includes a head imaging element 12, a vascular imaging element 14, including an anterior portion 16, a posterior portion 18, and a thoracic/lumbar imaging element 20. Each of these coil elements 12, 14, and 20 may be receive only or receive/transmit coils.

Each of the coil elements 12, 14, and 20 includes a lower surface conforming generally to the upper surface of a patient table 22 and has dimensions allowing them to fit within the bore 24 of an MRI magnet 26 as part of an MRI machine 27 when supported on a patient table 22.

The head imaging element 12 provides a base 28 and a lower surface conforming generally to the upper surface of a patient table 22. The base 28 includes laterally extending handles 30 allowing it to be easily lifted onto or off the patient table 22 and supports on its upper surface a "bird cage" style head coil 29. The head coil 29 includes a series of longitudinally extending rungs 32 spanning the distance between an upright superior end ring 34 and upright inferior end ring 36. Together, the rungs 23 and the end rings 34 and 36 define a generally cylindrical volume into which the head of a patient may fit.

In the preferred embodiment, conductors internal to the head coil 29 are connected to provide eight separate phased array coils arranged around the circumference of the volume, the coil elements being supported by the longitudinally extending rungs 32 according to methods well known in the art. This coil may be of a collapsible design described in U.S. application Ser. No. 10/303,582 entitled "Retracting MRI Head Coil", filed Nov. 22, 2002, and assigned to the assignee of the present invention and incorporated by reference. Alternatively, the head coil may be a quadrature style "bird cage" coil of a type well known in the art.

Collapsibility allows the inferior end ring 36 to move toward the superior end ring 34 allowing improved access to the volume of the coil. A cantilevered headrest 38 extends from an inferior edge of the base 28 upward then into the volume of the head coil 29. The headrest 38 holds the patient's head above the inferior end ring 36 to prevent interference between the movement of the inferior end ring 36 and the patient.

A cable 40 extending from the base 28 and terminating in connector 41 provides eight independent conductor sets communicating with the loops contained within the head coil 29 to provide received NMR signals from the head imaging element 12 to a switch box 42 as will be described. The connector 41 is selected to be compatible with a connector receptacle (not shown) on the MRI machine 27 so that the cable 40 may be connected directly to the MRI machine 27.

The posterior portion 18 of the vascular imaging element 14 has a lower surface fitting to the upper surface of the patient table 22 and a superior edge that abuts the inferior edge of the base 28 of the head imaging element 12 to fit closely thereto. The posterior portion 18 has a height comparable to that of the base 28 to provide continuous support for the patient 60 supine over the table 22 with the patient's head within the head imaging element 12. A notch 44 may be included in the superior edge of the posterior portion 18 to fit around the cantilevered headrest 38. Mechanical coupling between the coil element 12 and posterior portion 18 is not required but may be provided in the form of, for example, hook and loop fasteners, clips, or other attachment devices known in the art. Generally, the upper surface of the posterior portion 18 of vascular imaging element 14 is padded for patient comfort.

The posterior portion 18 may contain four independent phased array loops to provide four channels of information out of cable 46 having a connector 47 also communicating with switch box 42. The connector 47 is also selected to be compatible with a connector receptacle (not shown) on the MRI machine 27 so that the cable 46 may be connected directly to the MRI machine 27.

The phased array loops within the posterior portion 18 work in conjunction with four independent phased array loops in the anterior portion 16 positioned on the patient 60, above and generally parallel, to the posterior portion 18 over the patients chest. The anterior portion 16 is sized to fit about the chest of the patient 60 and therefore has a slight curvature to it or is flexible to conform thereto. Anterior portion 16 of the vascular imaging element 14 includes a projecting face mask portion 50 supporting loops or portions of loops that may fit about the jaw and lower neck of the patient 60 within the head imaging element 12 for improved imaging of this vascular tissue. The face mask portion 50 is sized to fit without interference within the head imaging element 12, and includes a nose bridge 52 fitting about the patient's nose, and neck extension wings 54 extending downward on the left and right sides of the patient's neck as shown in FIG. 2.

The anterior portion 16 may include cable 49 containing four independent conductors, one associated with each of the contained loops, the cable 49 also extending to switch box 42 to connect thereto by connector 53. The connector 53 is selected to be compatible with a connector receptacle (not shown) on the MRI machine 27 so that the cable 49 may be alternatively connected directly to the MRI machine 27.

Abutting the inferior edge of the posterior portion 18 is the superior edge of thoracic/lumbar imaging element 20 presenting a generally upwardly concave surface and a lower surface fitting against the top of the patient table 22 and under the back of the patient 60 when the patient 60 is supine on the patient table 22. The thickness of the thoracic/lumbar imaging element 20 is such as to provide continued support to the patient 60 even with the posterior portion 18. The thoracic/lumbar imaging element 20 provides laterally extending handles 56 allowing it to be easily placed on the table 22. Again, mechanical connection between the thoracic/lumbar imaging element 20 and the vascular imaging element 14 is not required, but may be provided in the form of hook and loop fasteners or other mechanical attachment mechanisms. The thoracic/lumbar imaging element 20 includes eight independent phased array coils providing eight independent signals out of cable 55 also connected to switch box 42 by means of connector 57. The connector 57 is selected to be compatible with a connector receptacle (not shown) on the MRI machine 27 so that the cable 55 may be connected directly to the MRI machine 27.

The head imaging element 12 may be used independently of the other coil elements 14 and 20 or may be selectively combined with these coil elements 14 and 20 by adding the vascular imaging element 14 and/or the vascular imaging element 14 and the thoracic/lumbar imaging element 20 to the head imaging element 12 as desired. Once assembled together, the elements may be connected one at a time via the switch box 42 to the MRI machine to provide a broad area of imaging.

Figure 3:
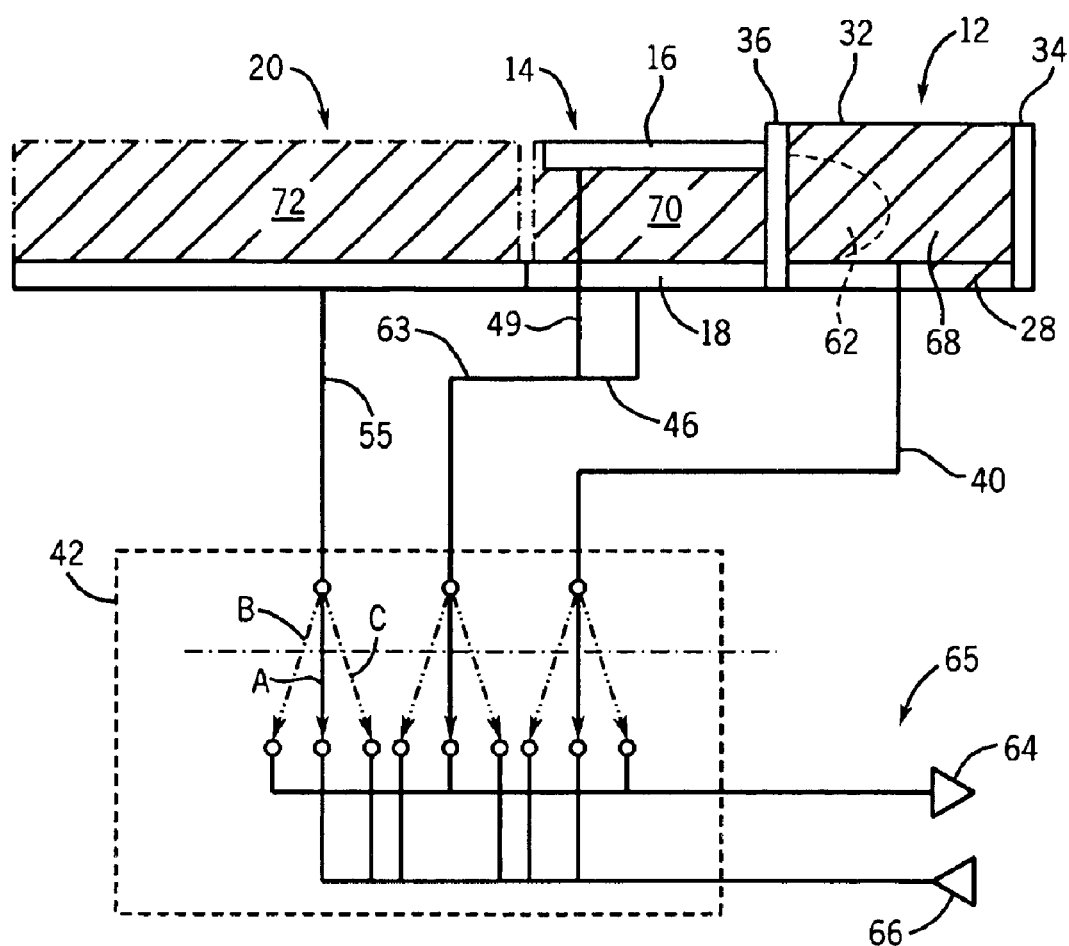
FIG. 3 is a schematic version of the coil of FIG. 2 showing the continuous regions of field sensitivity provided by the assembled modular elements and their connection via a switching system to MRI inputs and decoupling signals.

Referring to FIG. 3, the region of sensitivity 68 of head imaging element 12 generally includes the volume defined by the superior end ring 34, the inferior end ring 36, and the longitudinally extending rungs 32. The vascular imaging element 14 provides a region of sensitivity 70 generally between the anterior portion 16 and posterior portion 18, but includes a region 62 within the volume defined by the face mask portion 50. Finally, the region of sensitivity 72 of the thoracic/lumbar imaging element 20 is generally an area above that element. As such, a continuous volume of sensitivity is provided from the patient's head to the lumbar spine.

As shown in FIG. 3, switch box 42 may receive cables 55, 49, and 43 (joined as internal cable 63), and cable 40, each providing eight separate conductors associated with individual phased array coils in the various coil elements 12, 14, and 20. In this capacity, the switch box 42 includes connector receptacles 43 similar to those on the MRI machine 27. Switch box 42 implements a three-throw, three-pole switch, either mechanically or by solid-state electronics. By means of this switch, each of the eight separate conductors of cables 55, 63, and 40 may be alternately connected to an eight conductor cable 65 (shown in FIG. 1) leading to the MRI machine 27. The cable 65 may include a connector 45 (shown in FIG. 1) compatible with the connector receptacle of the MRI machine 27.

The connection of this cable 65 to the other cables 55, 63, and 40 is according to switch positions designated generally as (A), (B), and (C). In the A position, the conductors of cable 55 are connected to the corresponding conductors leading to input/output 64 of the MRI machine 27 whereas the conductors of cables 63 and 40 are connected to a decoupling current source 66 providing a current for decoupling. The decoupling circuit in each of the coil elements 12, 14, and 20 may, for example, use pin diodes within the coil elements 12, 14 and 20 to detune each of the coils when the decoupling current is received according to methods well known in the art. Thus in position A, thoracic/lumbar imaging element 20 may be activated for transmission and reception with the MRI machine 27 while coil elements 14 and 12 are decoupled.

Correspondingly, when the switch is in the B position, thoracic/lumbar imaging element 20 is connected to the decoupling current source 66 along with the head imaging element 12 and, the vascular imaging element 14 is connected to the input/output 64 of the MRI machine.

Finally, in the C position, only the cable 40 is connected to the input/output 64 of the MRI system and the other two coil elements 14 and 20 are connected to the decoupling current source 66.

The certainty in assembly provided by the modularity of coil elements 12, 14, and 20, and the electrical decoupling, allow cross coupling between the loops of these elements such as might affect their regions of sensitivity 68, 70, and 72 to be minimized. The designed modularity of the coil elements 12, 14, and 20 further assures an unbroken region of sensitivity for an area of imaging extending from the head to lower spine. If three general purpose local coils were collected at one time to provide a similar coverage region, sensitivity of the coils within the coverage regions would be unpredictable.

It is specifically intended that the present invention not be limited to the embodiments and illustrations contained herein, but include modified forms of those embodiments including portions of the embodiments and combinations of elements of different embodiments as come within the scope of the following claims.

We claim:

1. A modular local coil system for magnetic resonance imaging comprising:

at least three electrically independent multiple loop coil elements sized to assemble along an axis so as to provide a substantially continuous field coverage of a patient along that axis;

cables and electrical connectors associated with each of the coil elements providing communications with the multiple loops of each coil element, respectively, the connectors receivable by a connector receptacle on an MRI machine whereby each coil element may be individually and directly connected to the MRI machine; and a switch box providing coil-side connector receptacles receiving the connectors and an MRI machine-side cable and electrical connector receivable by the connector receptacle of the MRI machine, the switch box selectively connecting coil elements to the MRI machine;

whereby the coil sections may be used alone or in combination for different imaging requirements.

2. The modular local coil system of claim 1 wherein the switch box includes circuit paths connecting disabling signals to the coil elements that are not selectively connected to the MRI machine.

3. The modular local coil system of claim 1 wherein the coil elements include bases fitting against the upper surface of a patient table and abutting to align and space the coil elements from each other when assembled along the axis.

4. The modular local coil system of claim 1 wherein at least two of the coil elements, when assembled together include antenna structure from one coil fitting within a volume defined by antenna structure of a second coil.

5. The modular local coil system of claim 1 wherein at least one coil element is a head coil providing a volume for receiving a patient's head.

6. The modular local coil system of claim 1 wherein at least one coil element is a planar anterior coil fitting beneath the patient against a patient table.

7. The modular local coil system of claim 1 wherein at least one coil element is a pair of opposed anterior and posterior coils fitting about the patients upper torso.

8. A modular local coil system for magnetic resonance imaging comprising:

at least three electrically independent multiple loop coil elements coils sized to mechanically interfit along an axis so as to provide a substantially continuous coverage of a patient along that axis;

cables and electrical connectors associated with each of the coil elements providing communications with the multiple loops of each coil element, respectively;

a switch box providing coil-side connector receptacles receiving the connectors and a MRI machine side cable and electrical connector providing a connection receivable by a connector receptacle of the MRI machine, the switch box selectively connecting coil elements to the MRI machine;

wherein the switch box includes circuit paths connecting disabling signals to the coil elements that are not connected to the MRI machine.

9. The modular local coil system of claim 8 wherein the switch box includes circuit paths connecting disabling signals to the coil elements that are not selectively connected to the MRI machine.

10. The modular local coil system of claim 8 wherein the coil elements include bases fitting against the upper surface of a patient table and abutting to align and space the coil elements from each other when assembled along the axis.

11. The modular local coil system of claim 8 wherein at least two of the coil elements, when assembled together, include antenna structure from one coil fitting within a volume defined by antenna structure of a second coil.

12. The modular local coil system of claim 8 wherein at least one coil element is a head coil providing a volume for receiving a patient's head.

13. The modular local coil system of claim 8 wherein at least one coil element is a planar anterior coil fitting beneath the patient against a patient table.

14. The modular local coil system of claim 8 wherein at least one coil element is a pair of opposed anterior and posterior coils fitting about the patient's upper torso.

15. A modular local coil for magnetic resonance imaging comprising:
- a head imaging element fitting against an upper surface of a patient table and sized to receive the head of a supine patient supported by the patient table to receive NMR signals therefrom;
- a vascular imaging element fitting against the upper surface of a patient table and removably interfitting against an inferior end of the head imaging element to receive NMR signals from the neck and upper shoulder region of the supine patient;
- a thoracic/lumbar imaging element fitting against the upper surface of a patient table and removably interfitting against an inferior end of the vascular imaging element to receive NMR signals from the thoracic and lumbar regions;

wherein internal loops of each of the head imaging element, the vascular imaging element, and thoracic/lumbar imaging element are constructed to provide isolation between the loop when the imaging elements interfitting and to provide reception of NMR signals in a continuous region from the head to the lumbar region.

16. The modular local coil of claim 15 wherein the vascular imaging element includes a mask portion extending into the head imaging elements and proximate to a lower portion of the patient head when the head imaging element and vascular imaging element are interfitting.

17. The modular local coil of claim 15 wherein the head imaging element provides a phased array coil set having eight independent channels.

18. The modular local coil of claim 15 wherein the vascular imaging element includes an anterior and posterior section above and below the supine patient, respectively.

19. The modular local coil of claim 18 wherein the anterior portion provides a phased array coil set having four independent channels.

20. The modular local coil of claim 18 wherein the posterior portion provides a phased array coil set having four independent channels.

21. The modular local coil of claim 15 including a switch system connecting each of the head imaging element, the vascular imaging element, and the thoracic/lumbar imaging element one at a time to the MRI inputs.

22. The modular local imaging element of claim 15 wherein each of the coils includes active decoupling, detuning the imaging element when a decoupling current is received and, wherein the switch system connects those imaging element not connected to the MRI inputs to the decoupling current.

* * * * *

UNITED STATES PATENT AND TRADEMARK OFFICE
CERTIFICATE OF CORRECTION

PATENT NO. : 6,867,593 B2
DATED : March 15, 2005
INVENTOR(S) : Menon et al.

It is certified that error appears in the above-identified patent and that said Letters Patent is hereby corrected as shown below:

<u>Column 8,</u>
Line 4, "imaging elements interfitting" should be -- imaging elements are interfitting --.

Signed and Sealed this

Fourteenth Day of June, 2005

JON W. DUDAS
*Director of the United States Patent and Trademark Office*